(12) United States Patent
Spica et al.

(10) Patent No.: US 11,581,053 B2
(45) Date of Patent: Feb. 14, 2023

(54) MEMORY DEVICE TEST MODE ACCESS

(71) Applicant: Micron Technology, Inc., Boise, ID (US)

(72) Inventors: Michael R. Spica, Eagle, ID (US); David G. Springberg, Fort Collins, CO (US)

(73) Assignee: Micron Technology, Inc., Boise, ID (US)

(*) Notice: Subject to any disclaimer, the term of this patent is extended or adjusted under 35 U.S.C. 154(b) by 278 days.

(21) Appl. No.: 16/986,813

(22) Filed: Aug. 6, 2020

(65) Prior Publication Data
US 2022/0044750 A1 Feb. 10, 2022

(51) Int. Cl.
| | |
|---|---|
| G11C 29/00 | (2006.01) |
| G11C 29/10 | (2006.01) |
| G06F 9/30 | (2018.01) |
| G06F 11/22 | (2006.01) |
| G11C 29/14 | (2006.01) |

(52) U.S. Cl.
CPC .......... *G11C 29/10* (2013.01); *G06F 9/30101* (2013.01); *G06F 11/221* (2013.01); *G11C 29/14* (2013.01)

(58) Field of Classification Search
CPC ..... G11C 29/10; G11C 29/14; G06F 9/30101; G06F 11/21; G06F 11/221
USPC .............................................. 714/6.1, 25, 30
See application file for complete search history.

(56) References Cited

U.S. PATENT DOCUMENTS

| | | | |
|---|---|---|---|
| 6,314,049 B1 | 11/2001 | Roohparvar | |
| 6,975,149 B2 | 12/2005 | Mikhalev | |
| 9,985,873 B1* | 5/2018 | Don | .................... H04L 67/1097 |
| 10,203,896 B2* | 2/2019 | Yoon | ...................... G06F 3/0604 |
| 2013/0086283 A1* | 4/2013 | Miller | ................. G06F 13/4072 |
| | | | 710/11 |
| 2016/0378582 A1* | 12/2016 | Choi | ................... G06F 11/0727 |
| | | | 714/37 |

* cited by examiner

*Primary Examiner* — Christine T. Tu
(74) *Attorney, Agent, or Firm* — Brooks, Cameron & Huebsch, PLLC

(57) ABSTRACT

A system includes a memory device and a processing device coupled to the memory device. The processing device is configured to switch an operating mode of the memory device between a test mode and a non-test mode. The system further includes a test mode access component that is configured to access the memory device while the memory device is in the test mode to perform a test mode operation.

20 Claims, 8 Drawing Sheets

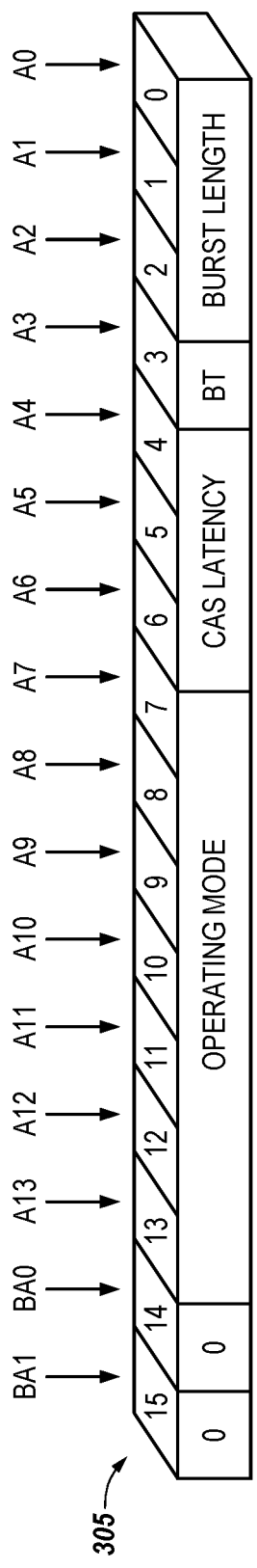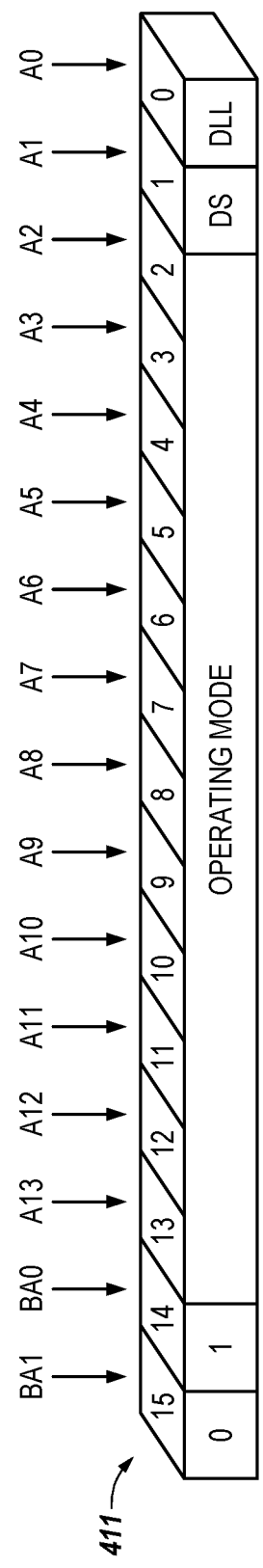

MEMORY DEVICE TEST MODE ACCESS

TECHNICAL FIELD

Embodiments of the disclosure relate generally to memory sub-systems, and more specifically, relate to memory device test mode access.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates an example of a mode register in accordance with some embodiments of the present disclosure.

FIG. 4 illustrates an example of an extended mode register in accordance with some embodiments of the present disclosure.

DETAILED DESCRIPTION

Figure 1:
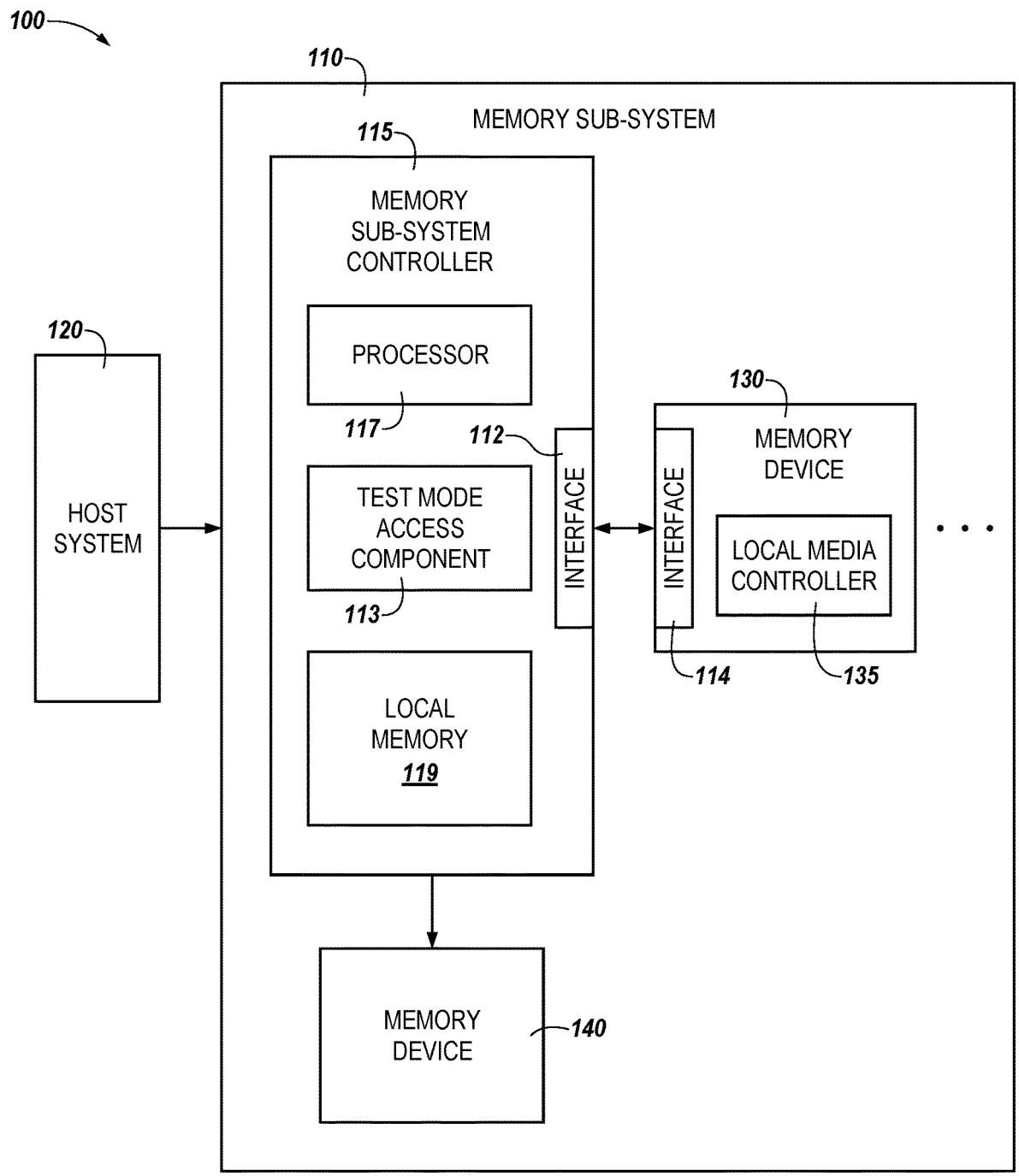
FIG. 1 illustrates an example computing system that includes a memory sub-system in accordance with some embodiments of the present disclosure.

Aspects of the present disclosure are directed to memory device test mode access. A memory sub-system can be a storage device, a memory module, or a hybrid of a storage device and memory module. Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A dynamic random-access memory (DRAM) is volatile memory that maintains data as long as a power is supplied to the DRAM. During an initialization or pre-initialization stage of manufacture of a memory sub-system, such as solid state drive (SSD), a DRAM device including multiple DRAM dies can be put into an initial training of the DRAM device and/or a return material authorization (RMA) process. For a failure analysis process, such as the RMA process, it is desirable to access particular types of data from a DRAM device, such as those data that can identify when/where DRAM dies that are determined to be defective were manufactured, which can be used to further identify other DRAM dies that were manufactured from the same manufacture and may likely be defective as well. However, these types of data are often inaccessible once DRAM dies are packaged into a DRAM device during initialization or pre-initialization stage of manufacture of the DRAM device, which makes those types of data inaccessible during the manufacture of the memory sub-system, such as an SSD. The inaccessibility makes the failure analysis process, such as the RMA process, time consuming and/or costly.

Aspects of the present disclosure address the above and other deficiencies by enabling the memory sub-system controller to access the memory device test modes during the memory sub-system manufacturing and testing phases. For example, previous memory sub-system controllers can be configured to access memory devices (e.g., DRAM devices) in accordance with a particular specification such as a particular JEDEC DDR interface protocol. However, signaling required to access memory device test modes may not be compliant with the particular interface protocol; therefore, prior memory sub-system controllers can be incapable of accessing the memory device test modes. Embodiments of the present disclosure provide a test mode access component capable of providing access to memory device test modes via a memory sub-system controller. For example, embodiments can provide additional data paths that can be utilized for accessing the memory device tests modes and to perform operations (e.g., read operations) by the same processing device that has been operating according to the DDR interface protocol in conventional approaches. During the test modes, data stored in DRAM can be accessed such that the data are readily available for any future process, such as the failure analysis process, which makes the failure analysis process more efficient.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a dual in-line memory module (DIMM) interface (e.g., DIMM socket interface that supports DDR), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

The memory devices 130 and 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM). Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type memory (e.g., 2D NAND and 3D NAND) and 3D cross-point array of non-volatile memory cells are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system controller 115 can be coupled to the memory device 130 and/or 140 via interfaces 112 and 114. For example, as illustrated in FIG. 1, the interface 112 is coupled to an interface 114 of the memory device 130, and the signal send to the memory device 130 from the memory sub-system controller 115 can be communicated from the interface 112 to the interface 114. The interface 112 and/or 114 can include (e.g., be in forms of) an interface connector and operate according to a particular interface protocol. As used herein, the term "interface connector" refers to a physical connector implemented with a particular one of various interface protocols (e.g., one of the interface protocols described above in association with the physical host interface). Interface connectors of the interfaces 112 and 114 each can include pins to couple buses between the interface connectors. For example, one end of a bus can be coupled to a particular one of the buses of the interface connector of the interface 112 and the other end of the bus can be coupled to a particular one of the buses of the interface connector of the interface 114. The buses coupling the interface 112 and interface 114 can include control buses, address buses, and/or buses for controlling (e.g., providing) a power to the memory device 130 and/or 140, among other buses.

The memory sub-system controller 115 can access the memory devices 130 and/or 140 in various operating modes, such as a test mode and/or a non-test mode. For example, while the memory devices 130 and/or 140 are in a non-test mode the memory sub-system controller 115 can access the memory devices 130 and/or 140 according to a particular interface protocol, such as DDR protocol as generated/defined by the joint electron device engineering council (JEDEC). However, operations performed according to the DDR protocol does not allow memory sub-system controller 115 to access a particular type of data stored in the memory devices 130 and/or 140, such as those data that are accessed during the test mode. By using a test mode access component 113, embodiments of the disclosure can provide memory sub-system 115 operating according to the DDR protocol a capability of providing a signal that is non-compliant with the DDR protocol to access a type of data that is inaccessible from a controller that operates according to the DDR protocol. Although not shown in FIG. 1 so as to not obfuscate the drawings, the test mode access component 113 can include various circuitry, such as special purpose circuitry in the form of an ASIC, FPGA, state machine, and/or other logic circuitry that can allow the test mode access component 113 to orchestrate and/or perform the operations described herein.

Figure 2:
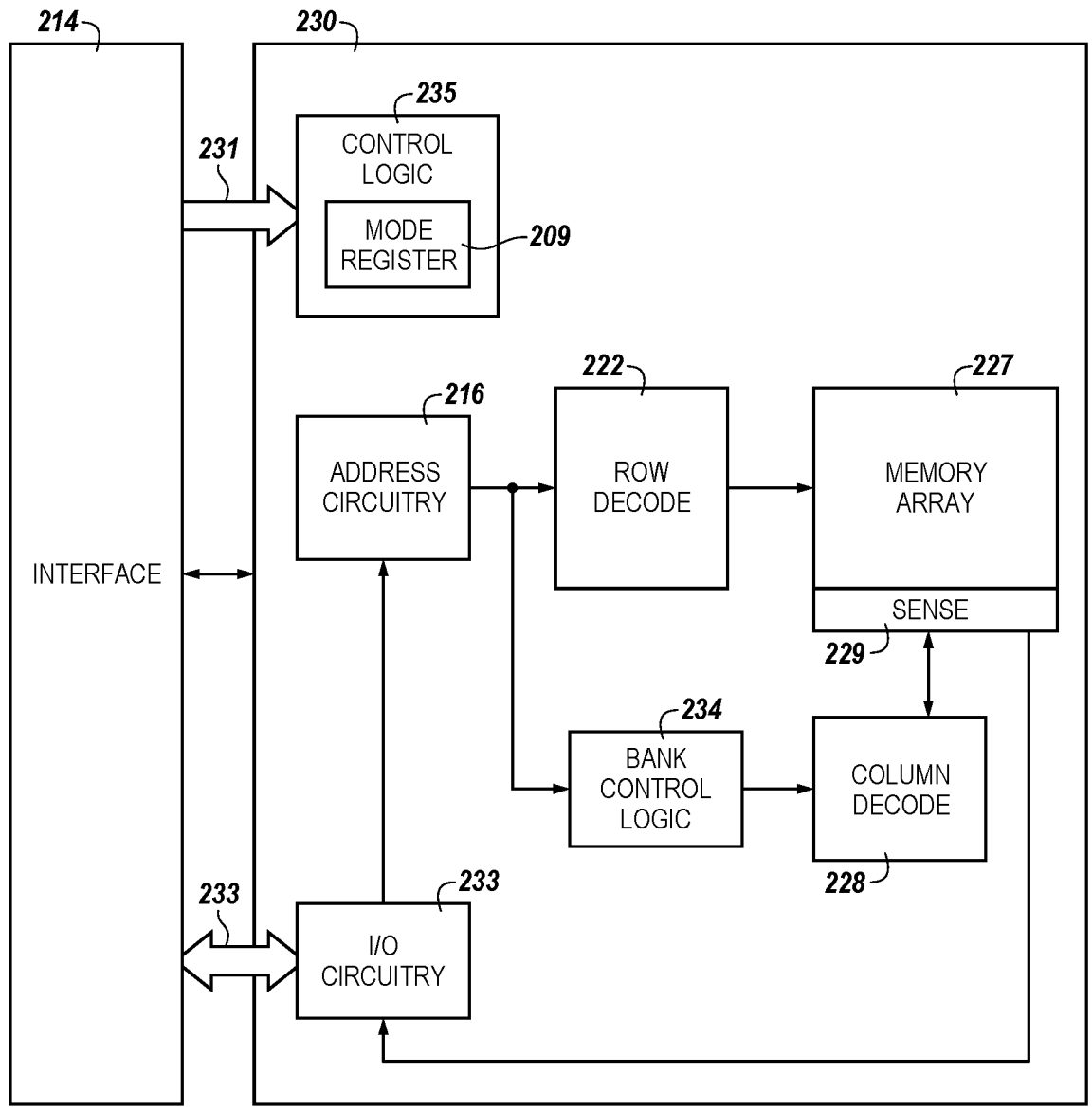
FIG. 2 illustrates an example of a memory device and an interface in accordance with some embodiments of the present disclosure.

FIG. 2 illustrates an example of a memory device 230 and an interface 214 in accordance with some embodiments of the present disclosure. The memory device 230 and interface 214 can be analogous to the memory device 130 (and/or memory device 140) and interface 114, respectively, illustrated in FIG. 1.

The memory device 230 includes address circuitry 216 to latch address signals provided over an address/control bus 231 (e.g., an address/control bus from the host 102). The memory device 230 can represent a single die of multiple memory dice in a "package," for example. Address signals are received by address circuitry 216 and decoded by row decode circuitry 222 and/or column decode circuitry 228 to access the memory array 227, which can comprise multiple banks of memory cells (e.g., DRAM cells). Although the address/control bus 231 is shown as a single bus, the bus 231 can comprise separate address and/or control buses, which can carry various signals, such as A0 to A13 signals, and/or BA0 and/or BA1 signals. As used herein, the term "A0 signal" refers to a signal carried by a bus coupled to an A0 pin of the interface connector (e.g., of the interface 214). Similarly, the bus carrying the A0 signal is referred to as a A0 bus. Similarly, the terms A1 to A13 signals refer to signals (e.g., address signals) carried by buses coupled to A1 to A13 pins, respectively, of the interface connector and the terms A1 to A13 buses refer to buses carrying A1 to A13 signals, respectively. Similarly, the terms BA0 and BA1 refer to signals (e.g., bank address signals) carried by buses coupled to BA0 and BA1 pins, respectively, of the interface connector and the BA0 and BA1 buses refer to buses carrying BA0 and BA1 signals, respectively.

These signals can be utilized to provide information (e.g., addresses) associated with memory operations (e.g., read and/or write operations) and/or access (e.g., program) registers, such as mode registers 207. For example, while the memory device is not in the initialization sequence, the A0 to A11 signals and/or BA0 and BA1 signals can be used to provide row, column, and/or bank addresses to which an operation (e.g., an operation corresponding to an active, read, and/or write command) is to be performed. In contrast, while the memory device 230 performs the initialization sequence, the A0 to A11 signals can be used to input mode settings during performance of a load mode register (LMR) operation on a mode register 209. As used herein, the term "LMR operation" can refer to an operation performed to access a mode register (e.g., mode register 209). The LMR operation is performed in response to an issuance of a LMR command. As described further in connection with FIG. 3 and FIG. 4, the mode registers 209 can include a mode register 305 and/or an extended mode register 411.

The address signals from the address circuitry 216 can be provided to row decode circuitry 222, column decode circuitry 228, and/or bank control logic 234. The bank control logic 234 can activate the row decode circuitry 222 and/or column decode circuitry 228 that corresponds to the bank address received from the address circuitry 216.

In response to being activated by the bank control logic 234, the column decode circuitry 228 and the row decode circuitry 222 each can decode the signals received from the address circuitry 216 to access the memory array 227. The row decode circuitry 222 can include logic (e.g., multiplexer circuitry), which can selectively coupled shared I/O lines to subsets of sensing components corresponding to the received row address and/or bank address from the address circuitry 216 and bank control logic 234, respectively. The column decode circuitry 228 can latch the column address and applies the latched column address to a decoder of the column decode circuitry 228.

The memory device 230 can be a storage module such as a DRAM package, among various other memory packages such as SRAM package, STT RAM package, PCRAM package, TRAM package, RRAM package, NAND package, and/or NOR package, for example. A memory package can include a plurality of memory dies (e.g., 2, 4, 8, and/or 16 memory dies) and each memory die can include a plurality of memory banks, such as DRAM banks.

Each memory die of a memory package is programmed, at the time of the manufacturing of each memory die, with a fuse identification (FID), which can be unique to each memory die so as to selectively distinguish one memory die from the others. The FID can identify, for example, a wafer lot ID, a date (e.g., week) the memory die was fabricated, a wafer ID, a die location on the wafer, and a fabrication facility ID of a respective memory die, which can be used to trace a manufacturing origination, such as when and/or where the memory die was manufactured. A traceability of the manufacturing origination via FID can be used for the failure analysis, such as RMD. As described herein, accessing the FID during, for example, initialization and/or pre-initialization stage of the memory sub-system and/or memory device can provide benefits such as making the FID readily available for the failure analysis.

The memory array 227 can include memory cells (e.g., DRAM memory cells) arranged in rows coupled by access lines (which can also be referred to herein as word lines or select lines) and columns coupled by sense lines (which can also be referred to herein as data lines or digit lines). Data stored in the memory array 227 can be read using sensing voltage and/or current changes on the sense lines using sensing circuitry 229. The sensing circuitry 150 can read and latch a row of data from the array of the memory array 227. In a number of embodiments, the sensing circuitry 229 can include a number of sense amplifiers and corresponding compute components, which can serve as an accumulator and can be used to perform arithmetic and/or logical operations on the data.

The I/O circuitry 223 can be used for bi-directional data communication with the host system (e.g., host system 230 illustrated in FIG. 1) over the data bus 233 (e.g., DQ connections). The data bus 233 can include multiple buses, such as an input/output data (DQ) bus (e.g., for carrying DQ0 to DQ30 signals), a data strobe (DQS) bus, a data mask (DQM) bus (e.g., for carrying DQM0 to DQM3 signals), an output enable (OE) bus, a row address strobe (RAS) bus, a column address strobe (CAS) bus, and/or a write enable (WE) bus.

The control logic 235 can be responsible for executing instructions from the host system (e.g., host system 120 illustrated in FIG. 1) and/or accessing the memory device 230. The control logic 235 can be a state machine, a sequencer, or some other type of controller and can be implemented in hardware, software, firmware, and/or combinations thereof.

The control logic 235 can receive clock signals and/or control signals, such as commands, over control bus 231 from a host system (e.g., host system 120 illustrated in FIG. 1). The signals that can be received to the control logic 235 via the control bus 231 can include various signals, such as power signals including a reset/power-down (RP #) signal, control signals including a chip select signal (CS #), a write enable signal (WE #), a column address strobe signal (CAS #), and/or a row address strobe signal (RAS #), and/or clock signals including clock enable signal (CKE) and/or complementary clock signals (e.g., CLK). An example command that can be issued from the memory sub-system controller (e.g., memory sub-system controller 115 illustrated in FIG. 1) includes a no operation (NOP) command, auto refresh command, active command, read command, and/or write command, among other commands. These commands can be defined via CS #, RAS #, CAS #, and/or WE # signals, among other signals.

FIG. 3 illustrates an example of a mode register 305 in accordance with some embodiments of the present disclosure. As described herein, the mode register 305 can be one of mode registers 209 of the memory device 230 illustrated in FIG. 2.

The mode register 305 can include sixteen bits, which can be referred to as M0 to M15 bits, respectively. For example, a bit "0" shown in FIG. 3 can be referred to as M0 bit. Similarly, bits "1" to "15" shown in FIG. 3 can be referred to as M1 to M15, respectively. As illustrated in FIG. 3, The M0 to M15 bits can be controlled by respective signals, such as A0 to A13 signals, and BA0 and BA1 signals, respectively.

The memory device can use M0, M1, and M2 bits, which can be controlled via A0, A1, and A2 signals, respectively, to specify a burst length. A corresponding burst length based on a combination of values (e.g., logical "1" or "0") indicated by M0, M1, and M2 bits is listed in Table 1 as follows.

TABLE 1

| Burst Length | | | |
|---|---|---|---|
| M2 | M1 | M0 | Burst Length |
| 0 | 0 | 0 | Reserved |
| 0 | 0 | 1 | 2 |
| 0 | 1 | 0 | 4 |
| 0 | 1 | 1 | 8 |
| 1 | 0 | 0 | Reserved |
| 1 | 0 | 1 | Reserved |
| 1 | 1 | 0 | Reserved |
| 1 | 1 | 1 | Reserved |

As used herein, the term "reserved" refers to a status, which there is not a dedicated purpose assigned thereto in accordance with a particular specification (e.g., DDR specification).

The memory device can use a M3 bit, which can be controlled via A3 signal to specify a burst type with one binary value (e.g., logical "0") indicating that the burst type is sequential and the other binary value (e.g., logical "1") indicating that the burst type is interleaved. The memory device can use M4, M5, and M6 bits, which can be controlled via A4, A5, and A6 signals, respectively, to specify a CAS latency. A corresponding CAS latency based on a combination of values (e.g., logical "1" or "0") indicated by M4, M5, and M6 bits is listed in Table 2 as follows.

TABLE 2

| CAS Latency | | | |
|---|---|---|---|
| M6 | M5 | M4 | CAS Latency |
| 0 | 0 | 0 | Reserved |
| 0 | 0 | 1 | Reserved |
| 0 | 1 | 0 | 2 |
| 0 | 1 | 1 | 3 (DDR400 only) |
| 1 | 0 | 0 | Reserved |
| 1 | 0 | 1 | Reserved |
| 1 | 1 | 0 | 2.5 |
| 1 | 1 | 1 | Reserved |

The memory device can use M7, ..., M13 bits, which can be controlled via A7, ..., A13 signals, respectively, to specify an operating mode. A corresponding operating mode based on a combination of values (e.g., logical "1" or "0") indicated by M7, ..., M13 bits is listed in Table 3 as follows.

TABLE 3

| Operating Mode | | | | | | | |
|---|---|---|---|---|---|---|---|
| M13 | M12 | M11 | M10 | M9 | M8 | M7 | Operating Mode |
| 0 | 0 | 0 | 0 | 0 | 0 | 0 | Normal Operation |
| 0 | 0 | 0 | 0 | 0 | 1 | 0 | Normal Operation/Reset DLL |
| — | — | — | — | — | — | — | All other states reserved |

M14 and M15 bits, which can be controlled via BA0 and BA1 signals, respectively, can be used to access the mode register. For example, the mode register can be accessed and programmed via a LMR command when both M14 and M15 bits are programmed to a same data value (e.g., logical "0" as illustrated in FIG. 3).

FIG. 4 illustrates an example of an extended mode register 411 in accordance with some embodiments of the present disclosure. As described herein, the mode register 411 can be one of mode registers 209 of the memory device 230 illustrated in FIG. 2.

The extended mode register 411 can include sixteen bits, which can be referred to as E0 to E15 bits, respectively. For example, a bit "0" shown in FIG. 3 can be referred to as E0 bit. Similarly, bits "1" to "15" shown in FIG. 3 can be referred to as E1 to E15, respectively. The E0 to E15 bits can be controlled by respective signals, such as A0 to A13 signals, and BA0 and BA1 signals, respectively.

The memory device can E0 bit, which can be controlled via A0 signal to enable/disable a delayed-locked loop (DLL) with one binary value (e.g., logical "0") indicating that the DLL is enabled and the other binary value (e.g., logical "1") indicating that the DLL is disabled. The memory device can E1 bit, which can be controlled via A1 signal to specify a drive strength with one binary value (e.g., logical "0") indicating a normal drive strength and the other binary value (e.g., logical "1") indicating a reduced drive strength.

The memory device can use E2, ..., E13 bits, which can be controlled via A2, ..., A13 signals, respectively, to specify an operating mode. A corresponding operating mode based on a combination of values (e.g., logical "1" or "0") indicated by E2, ..., E13 bits is listed in Table 4 as follows.

TABLE 4

| Operating Mode | | | | | | | | | | | | | |
|---|---|---|---|---|---|---|---|---|---|---|---|---|---|
| E13 | E12 | E11 | E10 | E9 | E8 | E7 | E6 | E5 | E4 | E3 | E2 | E[1:0] | Operating Mode |
| 0 | 0 | 0 | 0 | 0 | 0 | 0 | 0 | 0 | 0 | 0 | 0 | Valid | Reserved |
| — | — | — | — | — | — | — | — | — | — | — | — | — | Reserved |

E14 and E15 bits, which can be controlled via BA0 and BA1 signals, respectively, can be used to access the mode register. For example, the mode register can be accessed and programmed via a LMR command when both E14 and E15 bits are programmed to different data values, such as logical "1" and logical "0", respectively.

Figure 5:
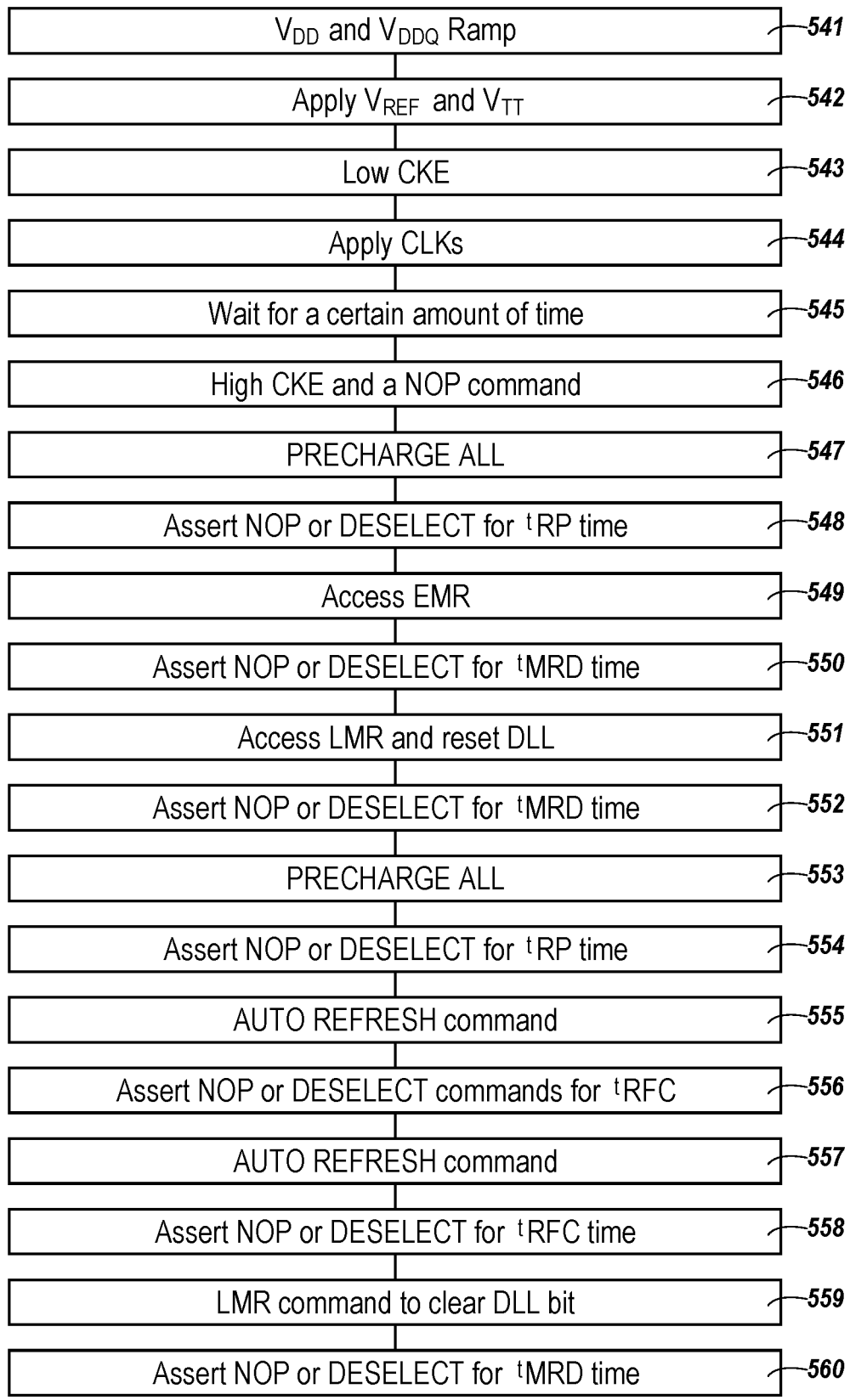
FIG. 5 illustrates a flow diagram corresponding to an initialization sequence of a memory device in accordance with some approaches.
Figure 6:
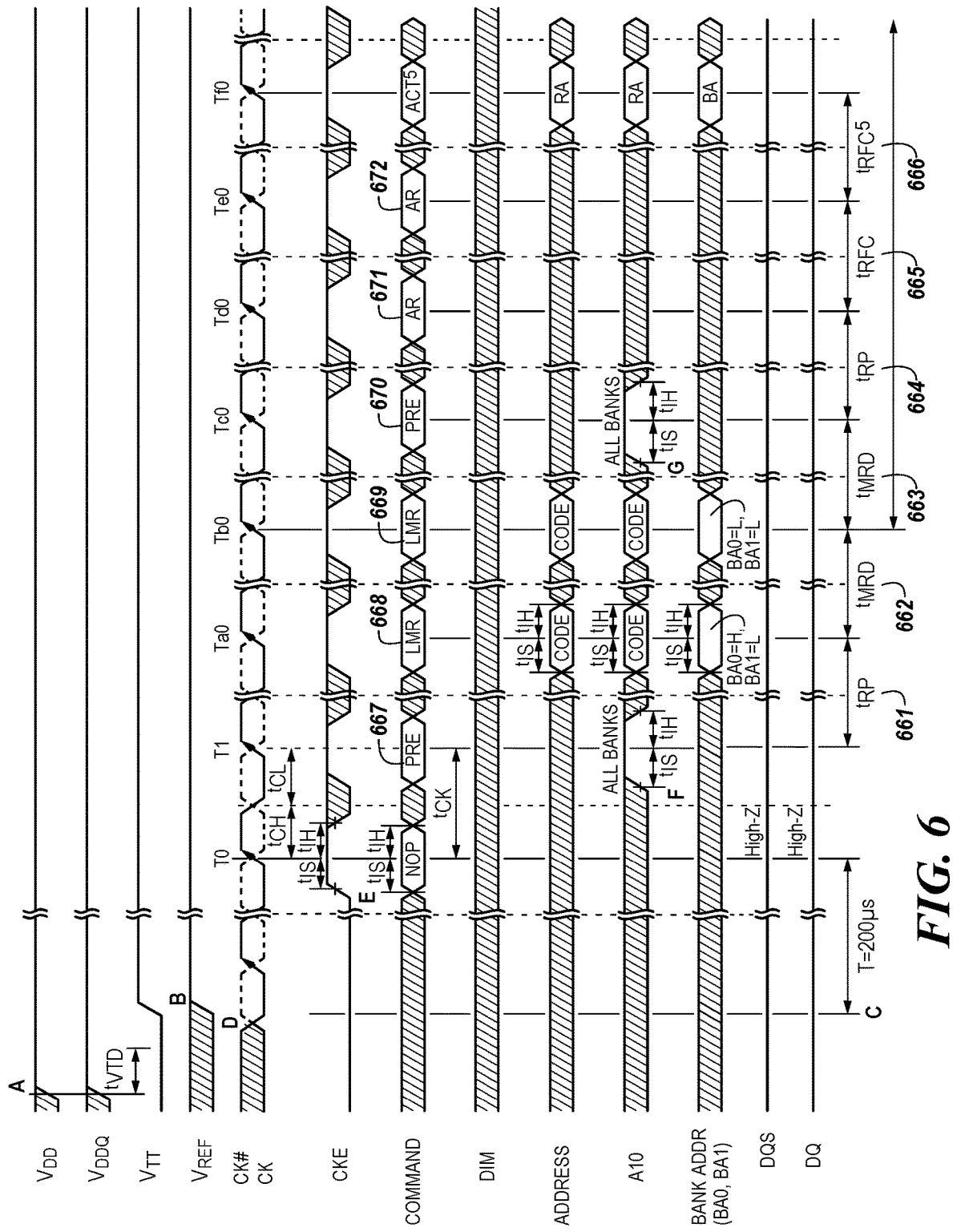
FIG. 6 illustrates a timing diagram corresponding to an initialization sequence of a memory device in accordance with some approaches.

FIG. 5 and FIG. 6 respectively illustrate a flow diagram and a timing diagram corresponding to an initialization sequence of a memory device in accordance with some approaches. The initialization sequence described in connection with FIG. 5 and FIG. 6 can be performed according to a sequence predetermined by the DDR specification.

At block 541, as well as indicated by point "A" illustrated in FIG. 6, a device core power voltage ("VDD") and a device I/O power voltage ("VDDQ") can start ramping substantially simultaneously, for example, to prevent a latch-up of the memory device. At block 542, as well as indicated by point "B" illustrated in FIG. 6, a reference voltage ("VREF") can ramp up and a termination voltage ("VDDQ") can start ramping subsequently. From point "B", the reference voltage can be substantially equal to a half of the device I/O power.

At block 543, as well as at least from point "C" illustrated in FIG. 6, a clock enable (CKE) signal can be driven low (e.g., LVCMOS logic low), while the power voltages such as the device core power, the device I/O power, the reference voltage, and the termination voltage are ramping up. The CKE signal being driven low can prevent the memory device from receiving undesired commands, at least while the memory device drives the I/O pins, such as DQ pins, DQS pins, and/or DQM pins.

At block 544, as well as at least from point "D" illustrated in FIG. 6, a stable clock signal (CK) can be provided to the memory device. At block 545, the CKE signal can wait for a particular amount of time prior to being driven high. For example, the particular amount of time can be approximately 200 microseconds (us) from point "C", as illustrated in FIG. 6.

At block 546, as well as indicated by point "E" illustrated in FIG. 6, the CKE signal can be driven high (e.g., SSTL_2 logic high), and a NOP or a DESELECT command (e.g., "NOP" shown in FIG. 6) can be asserted on command bus to prevent unwanted commands from being registered (e.g., executed) during idle or wait states without further affecting those operations that are already in progress. The command provided at block 546 can initialize the internal logic of the memory device, and SSTL_2 logic high state of the CKE can be maintained throughout the rest of the initialization sequence.

At block 547, a PRECHARGE ALL (e.g., PRE 617 shown in FIG. 6) command can be asserted on the command bus, for example, to prepare the sensing circuitry (e.g., sensing circuitry 229 illustrated in FIG. 2) to receive charges and/or to close banks that are open prior to being refreshed. Further, the A10 signal can be driven high from point "F" illustrated in FIG. 6. At block 548, the NOP or the DESELECT command can be asserted on the command bus at least for a time corresponding to a reset/power-down (RP) time (e.g., ′RP 661 illustrated in FIG. 6).

At block 549, a LMR command (e.g., LMR 668 illustrated in FIG. 6) can be issued to program the extended mode register (e.g., extended mode register 411 described in association with FIG. 4). For example, as described in connection with FIG. 4, at block 549, E0 and E1 can be programmed to configure (e.g., reset) the DLL and the I/O drive strength. As described in connection with FIG. 3, the LMR commands can be provided via address buses, such as A0 to A13, and/or BA0 and BA1 buses. As illustrated in FIG. 6, the BA0 signal can be driven high (e.g., logical high "1") and the BA1 signal can be driven low (e.g., logical low "0") to access/program the extended mode register.

At block 550, the NOP or the DESELECT command can be asserted on the command bus at least for a time corresponding to a MRD time (e.g., ′MRD 662 illustrated in FIG. 6). At block 551, the LMR command can be issued to program the mode register (e.g., mode register 305 described in association with FIG. 3). For example, at block 551, an operating mode of the mode register (e.g., mode register 305 illustrated in FIG. 3) can be configured. As described in connection with FIG. 3, the LMR commands (e.g., LMR 669 illustrated in FIG. 6) can be provided via address buses, such as A0 to A13 buses, and/or BA0 and BA1 buses. As illustrated in FIG. 6, both BA0 and BA1 signals can be driven low (e.g., logical low "0") to access/program the mode register.

At block 552, the NOP or the DESELECT command can be asserted on the command bus at least for a time corresponding to a MRD time (e.g., ′MRD 663 illustrated in FIG. 6). At block 553, a PRECHARGE ALL command (e.g., PRE 670 shown in FIG. 6) can be asserted on the command bus and the A10 signal can be driven high, as indicated by point "G" illustrated in FIG. 6. At block 554, the NOP or the DESELECT command can be asserted on the command bus at least for a time corresponding to a RP time (e.g., ′RP 664 illustrated in FIG. 6).

At block 555, the AUTO REFRESH command (e.g., AR 671 illustrated in FIG. 6) can be asserted on the command bus. At block 556, the NOP or the DESELECT command can be asserted on the command bus at least for a time corresponding to a memory refresh cycle (RFC) time (e.g., ′RFC 665 illustrated in FIG. 6). At block 557, the AUTO REFRESH command (e.g., AR 672 illustrated in FIG. 6) can be issued. At block 558, the NOP or the DESELECT command can be asserted on the command bus at least for a time corresponding to a RFC time (e.g., ′RFC 666 illustrated in FIG. 6).

At block 559, the LMR command can be issued to reset a DLL bit (e.g., E0 bit) of the extended mode register (e.g., program the DLL bit of the mode register to logical low "0"). At block 560, the NOP or the DESELECT command can be asserted on the command bus at least for a time corresponding to a MRD time.

Subsequent to the initialization sequence, the memory sub-system controller (e.g., the memory sub system controller 115 illustrated in FIG. 1) can provide one or more signals that are non-compliant with the DDR protocol to access data stored in the memory device (e.g., the memory device 130 illustrated in FIG. 1) that has been inaccessible while the memory sub-system controller has been operating according to the DDR protocol. The data that can be accessed using the signals non-compliant with the DDR protocol can include FID stored in the memory device, for example. Accessing the memory device using the signals is described in more detail in connection with FIG. 7 and FIG. 8.

Figure 7:
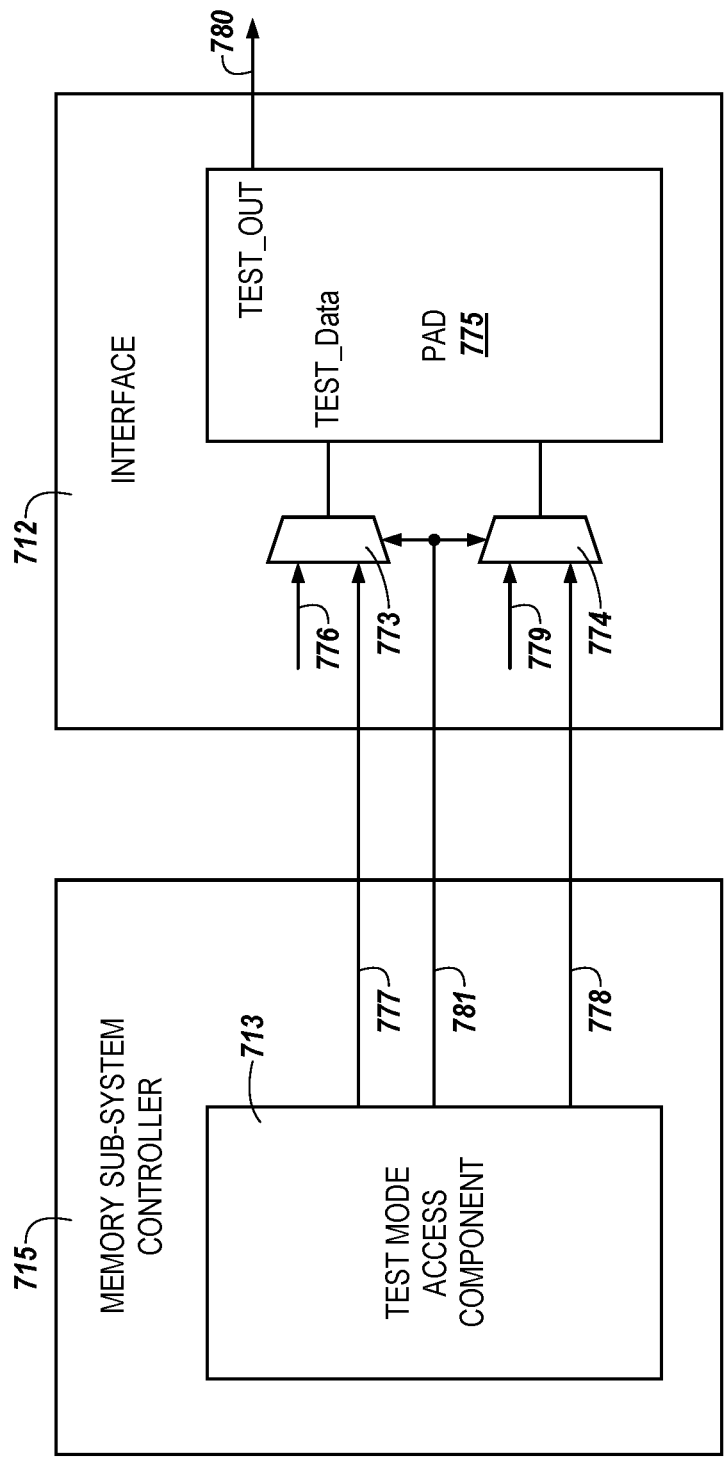
FIG. 7 illustrates an example of a memory sub-system controller and an interface in accordance with some embodiments of the present disclosure.

FIG. 7 illustrates an example of a memory sub-system controller 715 and an interface 714 in accordance with some embodiments of the present disclosure. The memory sub-system controller 715 and interface 714 to the memory sub-system controller 115 and interface 114, respectively, illustrated in FIG. 1.

As illustrated in FIG. 7, the interface 714 includes multiplexers 773 and 774, which receive multiple input signals and provide a selected one of the input signals to a pad 775. For example, the multiplexer 773 receives input signals 776 and 777, and the multiplexer 774 receives input signals 778 and 779, while the input signals 777 and 779 are provided from the test mode access component 713. Although embodiments are not so limited, the input signals 776 and 777 received at multiplexer 773 can be signals including data signals and the input signals 778 and 779 received at multiplexer 774 can be OE signals.

The test mode access component 713 can control, via a control signal 781, multiplexers 773 and 774 to cause multiplexers 773 and 774 to select one of the respective input signals. For example, the test mode access component 713 can cause multiplexers 773 and 774 to select input signals 776 and 778, which, when provided to the pad 780, can cause the pad 780 to provide a memory access signal 780 to the memory device (e.g., memory device 130 and/or 140 illustrated in FIG. 1) to put the memory device in a test mode and access data stored in the memory device that has been inaccessible while the memory sub-system controller 715 and the interface 712 have been operating according to the DDR protocol. Otherwise, for operating the memory device in a non-test mode, the test mode access component 713 can cause multiplexers 773 and 774 to select input signals 777 and 779, which, when provided to the pad 780 and to the memory device, cause the memory device to operate according to the DDR protocol.

The memory access signal 780 can be a set of signals that are (e.g., sequentially) provided to the memory device at different times and/or at a time. In some embodiments, the memory access signal 780 can be used to put the memory device in a particular operation mode, such as test mode, as described herein. Subsequent to enabling the test mode, the memory access signal 780 can be used to control signals communicated between the interface 714 (e.g., interface 112 of the memory device 130 illustrated in FIG. 1) and the memory device (memory device 130 and/or 140 illustrated in FIG. 1) to program various components of the memory device.

Figure 8:
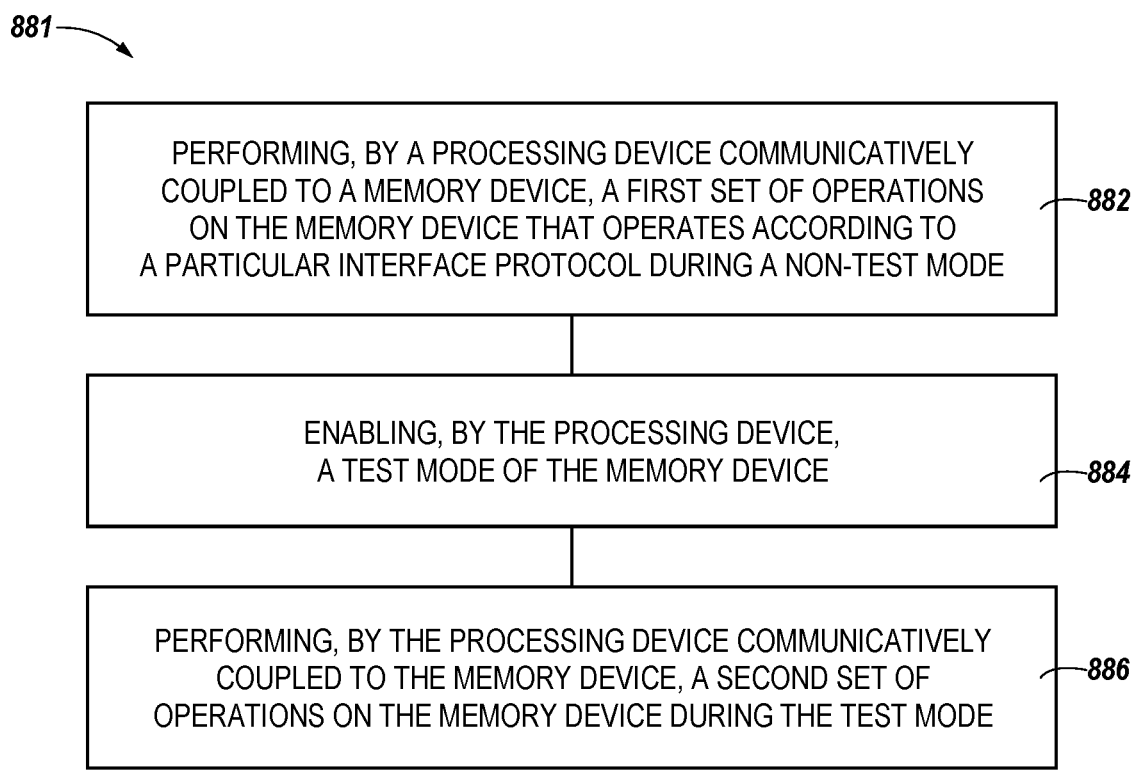
FIG. 8 illustrates a flow diagram of an example method to access a memory device in accordance with some embodiments of the present disclosure.

FIG. 8 illustrates a flow diagram of an example method 881 to access a memory device (e.g., memory device 230 illustrated in FIG. 2) in accordance with some embodiments of the present disclosure. The method 881 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by the test mode access component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 882, a first set of operations can be performed by a processing device communicatively coupled to a memory device that operates according to a particular interface protocol during a non-test mode. As described herein, the particular interface protocol can be DDR protocol. The first set of operations performed during the non-test mode can include operations performed according to the DDR initialization sequence, as described herein.

At block 884, a test mode of the memory device can be enabled. At block 886, the second set of operations can be performed during the test mode. The second set of operations performed during the test mode are non-compliant with the particular interface protocol, such as DDR protocol. For example, the second set of operations are those operations not defined in the DDR specification. Accordingly, the second set of operations can access data stored in the memory device that has been inaccessible from performing operations of the DDR protocol. As an example, the data that can be accessed by performing the second set of operations can include FID of the memory device.

In some embodiments, the second set of operations can be performed to program a mode register of the memory device to access the data stored in the memory device. The mode register programmed by the second set of operations can be a mode register that isn't programmable from performing operations of the DDR protocol. The mode register programmed by the second set of operations can be a different mode register than those (e.g., the mode register 209 illustrated in FIG. 2) described previously.

Figure 9:
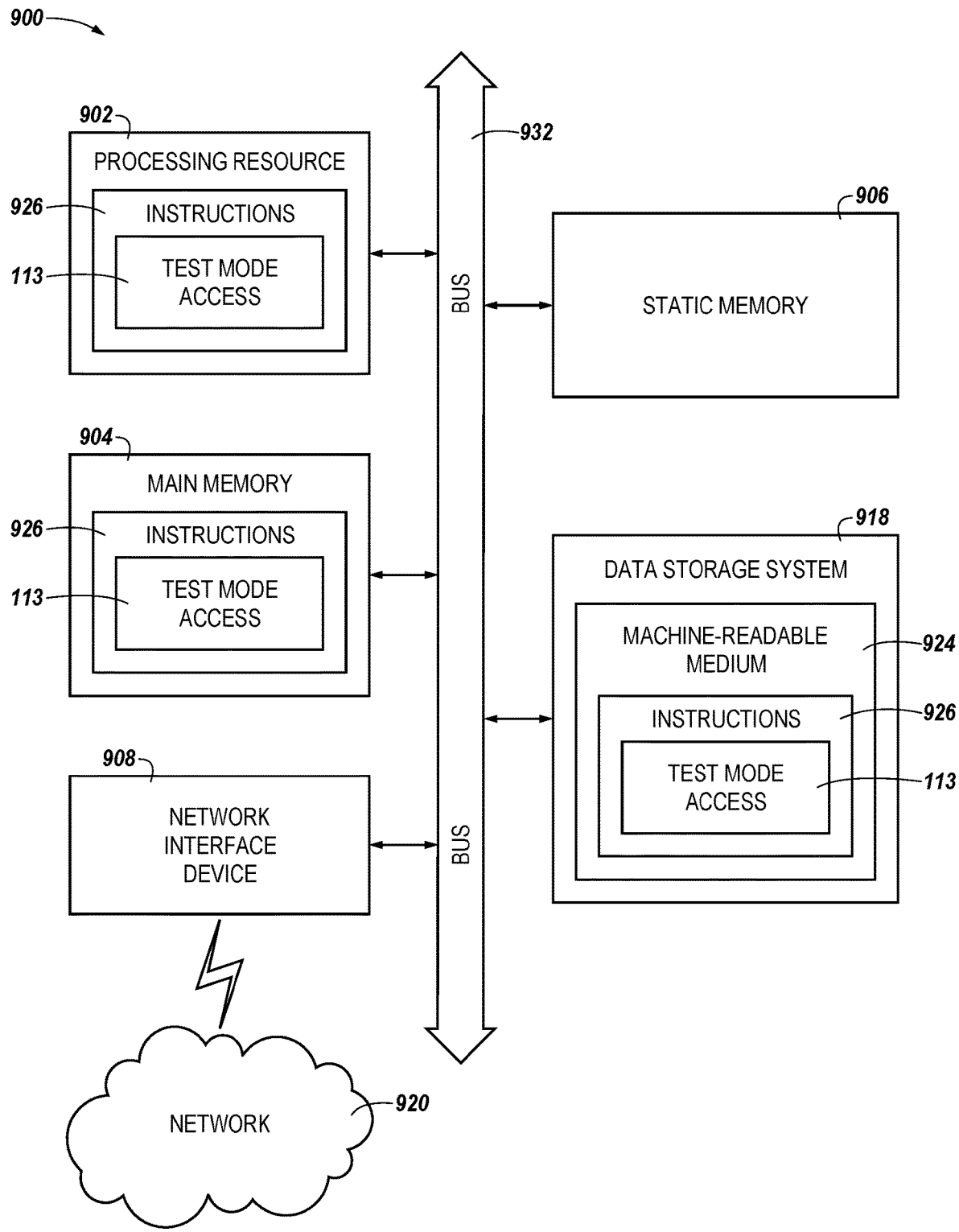
FIG. 9 is a block diagram of an example computer system in which embodiments of the present disclosure may operate.

FIG. 9 illustrates an example machine of a computer system 900 within which a set of instructions, for causing the machine to perform one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the test mode access component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or another machine capable of executing a set of instructions (sequential or otherwise) that specify actions to be taken by that machine. Further, while a single machine is illustrated, the term "machine" shall also be taken to include a collection of machines that individually or jointly execute a set (or multiple sets) of instructions to perform one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

The processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 941 can further include a network interface device 908 to communicate over the network 920.

The data storage system 918 can include a machine-readable storage medium 924 (also known as a computer-readable medium) on which is stored one or more sets of instructions 926 or software embodying one or more of the methodologies or functions described herein. The instructions 926 can also reside, completely or at least partially, within the main memory 904 and/or within the processing device 902 during execution thereof by the computer system 941, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to a compute component (e.g., the test mode access component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
 a memory device;
 a processing device coupled to the memory device via an interface and a test mode access component, wherein the processing device is configured to switch an operating mode of the memory device between a test mode and a non-test mode; and
 the test mode access component configured to control the interface to cause the interface to:
  provide, to the memory device, a first signal compliant with a particular interface protocol during the non-test mode; and
  provide, to the memory device, a second signal non-compliant with the particular interface protocol during the test mode, wherein the second signal provided to the memory device causes the memory device to provide a particular type of data stored in the memory device to the processing device.

2. The system of claim 1, wherein the processing device is configured to communicate with the memory device via signaling in accordance with the particular protocol, and through which the test mode access component is configured to communicate with the memory device.

3. The system of claim 2, wherein the system comprises a storage subsystem, and wherein the storage subsystem includes a controller comprising the processing device and the test mode access component.

4. The system of claim 2, wherein the second signal is to cause the memory device to perform a fuse identification (FID) read operation.

5. The system of claim 2, wherein signaling between the test mode access component and the interface is non-compliant with the particular protocol.

6. The system of claim 5, wherein the particular protocol is a double data rate (DDR) JEDEC standard protocol.

7. The system of claim 1, wherein the test mode access component is configured to cause the memory device to program a register of the memory device to access the memory device.

8. The system of claim 7, wherein the register comprises a mode register.

9. A method, comprising:
providing a first control signal from a test mode access component to an interface to cause the interface to receive, during a non-test mode, a first set of signals, wherein the first control signal is provided to allow a processing device to perform a first set of operations on a memory device that operates according to a particular interface protocol during a non-test mode;
enabling, by the processing device, a test mode of the memory device; and
providing a second control signal from the test mode access component to the interface to cause the interface to receive, during a test mode, a second set of signals, wherein:
the second control signal is provided to allow the processing device to perform a second set of operations on the memory device during the test mode; and
the second set of operations is non-compliant with the particular interface protocol.

10. The method of claim 9, further comprising retrieving a fuse identification (FID) of a memory die of the memory device by performing the second set of operation on the memory device.

11. The method of claim 9, wherein performing the second set of operations on the memory device during the test mode comprises programming a mode register of the memory device to access data stored in the memory device.

12. The method of claim 9, further comprising operating the memory device to perform the first set of operations according to a double data rate (DDR) initialization sequence.

13. A system, comprising:
a memory device; and
a processing device comprising a test mode access component, the processing device configured to communicate with the memory device via an interface comprising a first interface portion, a second interface portion, and the test mode access component; and wherein the test mode access component is configured to control the first interface portion to cause the first interface portion to:
receive, during a non-test mode, a first set of signals to cause the first interface portion to provide a signal compliant with a particular interface protocol; and
receive, during a test mode, a second set of signals to cause the first interface portion to provide, in response to receipt of the second set of signals, a signal non-compliant with the particular interface protocol to the memory device, wherein the second set of signals provided to the memory device cause the memory device to provide a particular type of data stored in the memory device to the processing device.

14. The system of claim 13, wherein the particular interface protocol is a double data rate (DDR) JEDEC standard protocol.

15. The system of claim 13, wherein:
the memory device is configured to perform, in response to receipt of the signal compliant with the particular interface protocol, a set of operations according to the particular interface protocol; and
the particular type of data stored in the memory device is inaccessible from performing the set of operations according to the particular interface protocol.

16. The system of claim 13, wherein the first interface portion is configured to provide the signal compliant with the particular interface protocol via an address bus or a bank address bus.

17. The system of claim 13, wherein the first interface portion is located within the processing device and comprises an input/output (I/O) pad and a plurality of multiplexers comprising a first multiplexer and a second multiplexer that are coupled to the I/O pad.

18. The system of claim 17, wherein the processing device is configured to, during the test-mode:
cause the first multiplexer to receive one of the second set of signals; and
cause the first multiplexer to provide, in response to receipt of the one of the second set of signals, an output enable (OE) signal to the I/O pad.

19. The system of claim 17, wherein the processing device is configured to:
cause the second multiplexer to receive one of the second set of signals; and
cause the second multiplexer to provide, in response to receipt of the one of the second set of signals, a data signal to the I/O pad.

20. The system of claim 13, wherein the memory device is a synchronous dynamic random access memory (SDRAM) device.

* * * * *